United States Patent

Hamamoto

[11] Patent Number: 6,087,691
[45] Date of Patent: *Jul. 11, 2000

[54] SEMICONDUCTOR DEVICE HAVING LOWER MINORITY CARRIER NOISE

[75] Inventor: Takeshi Hamamoto, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/853,180

[22] Filed: May 7, 1997

[30] Foreign Application Priority Data

Feb. 4, 1997  [JP]  Japan ................................ 9-021533

[51] Int. Cl.$^7$ ................................................. H01L 27/108
[52] U.S. Cl. .......................... 257/297; 257/394; 257/400
[58] Field of Search ................................... 257/297, 394, 257/400

[56] References Cited

U.S. PATENT DOCUMENTS

| | | | |
|---|---|---|---|
| 4,044,373 | 8/1977 | Nomiya et al. | 257/373 |
| 4,163,245 | 7/1979 | Kinoshita | 257/297 |
| 4,315,781 | 2/1982 | Henderson | 257/400 |
| 4,587,542 | 5/1986 | Rao | 257/297 |
| 4,635,085 | 1/1987 | Taguchi | 257/306 |
| 4,658,283 | 4/1987 | Koyama | 257/297 |
| 4,695,864 | 9/1987 | Kawamoto | 257/297 |
| 5,789,789 | 8/1998 | Hayakawa | 257/400 |

FOREIGN PATENT DOCUMENTS 59-152660  8/1984  Japan.
61-185965  8/1986  Japan.

*Primary Examiner*—Gene M. Munson
*Attorney, Agent, or Firm*—Oblon, Spivak, McClelland, Maier & Neustadt, P.C.

[57] ABSTRACT

On a $p^{++}$ substrate (1) provided is a $p^-$ epitaxial layer (2) having an impurity concentration lower than that of the $p^{++}$ substrate (1). A p well (3) is formed in a portion of the $p^-$ epitaxial layer 2 and further $n^+$ diffusion layers (4a and 4b) are selectively formed in the p well (3). A memory cell capacitor (5) is connected onto the $n^+$ diffusion layer 4b. On the other hand, an no diffusion layer (6) is selectively formed in the $p^-$ epitaxial layer (2) separately from the p well (3), to which an external signal input circuit (7) is connected. Further, a $p^{++}$ diffusion layer 9a is provided between the external signal input circuit (7) serving as a source for injection of the minority carriers, i.e., electrons and the $n^+$ diffusion layer (4b) connected to the memory cell capacitor (5), for blocking the entry of the minority carries. The $p^{++}$ diffusion layer (9a) extends up to such a depth as to reach the $p^{++}$ substrate (1) from a surface of the $p^-$ epitaxial layer (2). Having this structure, a semiconductor device which does not allow the electrons injected to the $p^-$ epitaxial layer from the external signal input circuit to reach the memory cell capacitor can be provided.

4 Claims, 8 Drawing Sheets

SEMICONDUCTOR DEVICE HAVING LOWER MINORITY CARRIER NOISE

BACKGROUND OF THE INVENTION

1. Field of the Invention

The present invention relates to a semiconductor device, and more particularly to a semiconductor memory device in which an epitaxial layer is provided on a semiconductor substrate of high impurity concentration and has an impurity concentration lower than that of the semiconductor substrate.

2. Description of the Background Art

FIG. 13 is a cross section showing a partial structure of a DRAM (Dynamic Random Access Memory) in which an epitaxial layer is provided on a semiconductor substrate, as an example of the background art. In the DRAM of FIG. 13, a p-type epitaxial layer 2 (referred to as "p⁻ epitaxial layer" hereinafter) is provided on a p-type semiconductor substrate 1 of high impurity concentration (referred to as "p⁺⁺ substrate" hereinafter) and has an impurity concentration lower than that of the p⁺⁺ substrate, a p well 3 is formed in a portion of the p⁻ epitaxial layer 2 and n⁺ diffusion layers 4a and 4b are selectively formed in the p well 3. A memory cell capacitor 5 is connected onto the n⁺ diffusion layer 4b. The n₊ diffusion layers 4a and 4b serving as source and drain constitute a transistor, with a gate electrode 8. On the other hand, an n⁺ diffusion layer 6 is selectively formed in the p⁻ epitaxial layer 2 separately from the p well 3, to which an external signal input circuit 7 is connected.

In the background-art DRAM, when minority carriers (electrons in a p-type epitaxial layer and positive holes in an n-type epitaxial layer) injected to the p⁻ epitaxial layer 2 from the external signal input circuit 7 through the n⁺ diffusion layer 6 reach the n⁺ diffusion layer 4b via the p⁻ epitaxial layer 2, electric charges accumulated in the memory cell capacitor 5 decrease to cause a loss of stored information. That results in a failure of the DRAM.

In the structure where the p⁻ epitaxial layer 2 is provided on the p⁺⁺ substrate 1 of higher impurity concentration as shown in FIG. 13, particularly, the minority carriers injected to the p⁻ epitaxial layer 2 from the external signal input circuit 7 are reflected from an interface between the p⁻ epitaxial layer 2 and the p⁺⁺ substrate 1 under the influence of an internal potential caused by a difference in impurity concentration between the p⁻ epitaxial layer 2 and the p⁺⁺ substrate 1, never entering the p⁺⁺ substrate 1, and then captured in the n⁺ diffusion layer 4a, 4b or the p well 3. That disadvantageously leads to an increase in failure of the DRAM due to the injection of the minority carriers.

SUMMARY OF THE INVENTION

The present invention is directed to a semiconductor device. According to a first aspect of the present invention, the semiconductor device comprises: a semiconductor thin film of a first conductivity type provided on a semiconductor substrate of the first conductivity type; and a minority-carrier source for generating minority carriers of a second conductivity type opposite to the first conductivity type and an impurity diffusion region of the first conductivity type each selectively provided in the semiconductor thin film. In the semiconductor device of the first aspect, an impurity concentration of the impurity diffusion region is higher than an impurity concentration of the semiconductor thin film.

According to a second aspect of the present invention, in the semiconductor device of the first aspect, the impurity diffusion region extends up to such a depth as to reach the semiconductor substrate from a surface of the semiconductor thin film.

According to a third aspect of the present invention, in the semiconductor device of the first aspect, the impurity concentration of the semiconductor thin film is lower than that of the semiconductor substrate, and a band structure of the semiconductor thin film located between the impurity diffusion region and the semiconductor substrate gets closer to that of the impurity diffusion region than that of the semiconductor thin film located elsewhere according to a difference in impurity concentration.

According to a fourth aspect of the present invention, the semiconductor device comprises: a semiconductor thin film of a first conductivity type provided on a semiconductor substrate of the first conductivity type; a first impurity diffusion layer of the first conductivity type provided in a form of layer in the semiconductor thin film; a second impurity diffusion layer of the first conductivity type provided in a form of layer at a depth shallower than a depth at which the first impurity diffusion layer is provided in the semiconductor thin film; and a minoritycarrier source for generating minority carriers of a second conductivity type opposite to the first conductivity type and an impurity diffusion region of the first conductivity type each selectively provided in the semiconductor thin film. In the semiconductor device of the fourth aspect, each of impurity concentrations of the impurity diffusion region and the first and second impurity diffusion layers is higher than that of the semiconductor thin film, and the impurity diffusion region extends up to such a depth as to reach the first impurity diffusion layer from a surface of the semiconductor thin film.

According to a fifth aspect of the present invention, in the semiconductor device of any of the first to fourth aspects, the impurity diffusion region is provided so as to surround the minority-carrier source.

In the semiconductor device of the first aspect, since the impurity concentration of the impurity diffusion region is higher than that of the semiconductor thin film, a potential barrier is caused by the difference in impurity concentration between the semiconductor thin film and the impurity diffusion region. Therefore, the minority carriers injected to the semiconductor thin film from the minority-carrier source can not go across the impurity diffusion region.

In the semiconductor device of the second aspect, the minority carriers generated in the minority-carrier source can not go across the impurity diffusion region whatever depth they travel since the impurity diffusion region extends up to such a depth as to reach the semiconductor substrate from the surface of the semiconductor thin film.

Moreover, the impurity diffusion region, which does not electrically insulate the semiconductor thin film completely as distinct from an insulation, allows majority carriers serving as signals to move therethrough if they have an energy beyond the potential barrier while blocking the travel of the minority carriers generated in the minority-carrier source through the impurity diffusion region.

In the semiconductor device of the third aspect, the impurity diffusion region does not extend up to such a depth as to reach the semiconductor substrate from the surface of the semiconductor thin film to leave a clearance between the impurity diffusion region and the semiconductor substrate. It seems that the minority carriers generated in the minority-carrier source can go beyond the impurity diffusion region through the clearance. However, a combination of the impurity diffusion region and the semiconductor substrate changes the band structure in the clearance to produce a potential barrier against the minority carriers. Thus, the minority carries can never go beyond the impurity diffusion region.

Moreover, the clearance between the impurity diffusion region and the semiconductor substrate allows majority carriers to travel freely from one side of the impurity diffusion region to another, thereby keeping a potential level on both sides of the impurity diffusion region constant.

In the semiconductor device of the fourth aspect, since the first and second impurity diffusion layers of the first conductivity type which is the same as that of the semiconductor thin film are provided in a form of layer in the semiconductor thin film, the minority carriers generated in the minority-carrier source travel through a region between the surface of the semiconductor thin film and the second impurity diffusion layer, between the first and second impurity diffusion layers or between the first impurity diffusion layer and the semiconductor substrate under the influence of internal potential caused by the difference in impurity concentration.

Since the impurity diffusion region extends up to such a depth as to reach the first impurity diffusion layer from the surface of the semiconductor thin film, however, the minority carriers traveling between the surface of the semiconductor thin film and the second impurity diffusion layer and between the second impurity diffusion layer and the first impurity diffusion layer can not go across the impurity diffusion region as being blocked by the potential barrier due to the difference in impurity concentration between the semiconductor thin film and the impurity diffusion region.

The semiconductor device of the fifth aspect, which includes the impurity diffusion region provided so as to surround the minority-carrier source, can block the travel of the minority carriers through the impurity diffusion region with higher reliability as compared with that which includes the impurity diffusion region provided partially in a periphery of the minority-carrier source.

An object of the present invention is to provide a semiconductor device with a structure to prevent the minority carriers injected from the external signal input circuit 7 to the p⁻ epitaxial layer 2 from reaching the n⁺ diffusion layer 4b.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
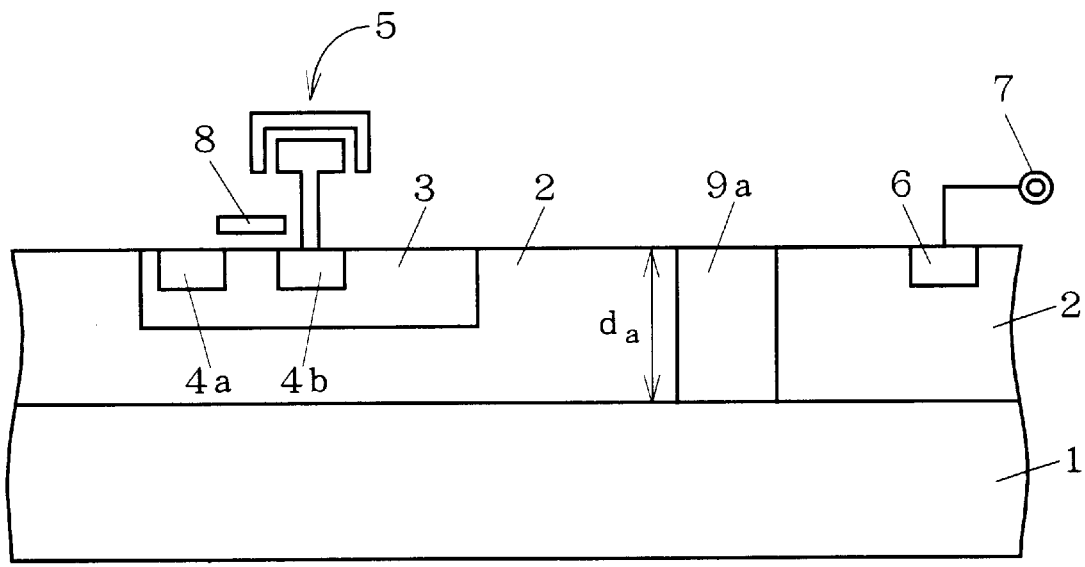
FIG. 1 is a cross section showing a structure of a semiconductor device in accordance with a first preferred embodiment of the present invention.

FIG. 1 is a cross section showing a structure of a semiconductor device in accordance with the first preferred embodiment of the present invention. On the p⁺⁺ substrate 1 provided is the p⁻ epitaxial layer 2 having an impurity concentration lower than that of the p⁺⁺ substrate 1. The p well 3 is formed in a portion of the p⁻ epitaxial layer 2 and further the n⁺ diffusion layers 4a and 4b are selectively formed in the p well 3. The memory cell capacitor 5 is connected onto the n⁺ diffusion layer 4b. The n⁺ diffusion layers 4a and 4b serving as source and drain constitute a transistor, with the gate electrode 8. On the other hand, the n⁺ diffusion layer 6 is selectively formed in the p⁻ epitaxial layer 2 separately from the p well 3, to which the external signal input circuit 7 is connected. Further, a p⁺⁺ diffusion layer 9a is provided between the external signal input circuit 7 serving as a source for injection of the minority carriers (electrons in this case) and the n⁺ diffusion layer 4b connected to the memory cell capacitor 5, for blocking the entry of the minority carries.

In the first preferred embodiment shown in FIG. 1, the p⁺⁺ diffusion layer 9a extends up to such a depth da as to completely reach the p⁺⁺ substrate 1 from a surface of the p⁻ epitaxial layer 2.

Figure 2:
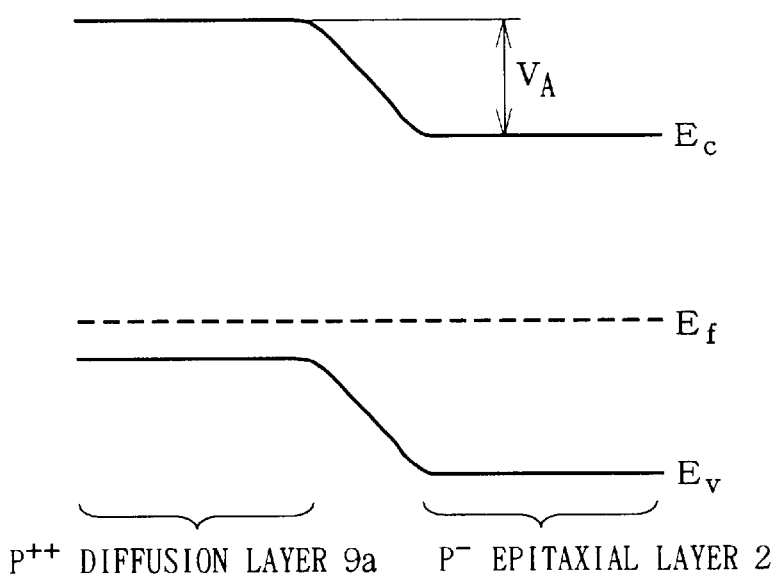
FIG. 2 shows an internal potential of the semiconductor device in accordance with the first preferred embodiment of the present invention.

FIG. 2 shows an energy band of the p⁻ epitaxial layer 2 and the p⁺⁺ diffusion layer 9a. In FIG. 2, reference characters $E_c$, $E_v$ and $E_f$ represent the minimum energy of a conduction band, the maximum energy of a valence band and Fermi level, respectively. As can be seen from FIG. 2, there exists a potential barrier $V_A$ between the p⁻ epitaxial layer 2 and the p⁺⁺ diffusion layer 9a due to the difference in impurity concentration. If the minority carriers injected to the p⁻ epitaxial layer 2 from the external signal input circuit 7 have an energy lower than the potential barrier $V_A$, the minority carriers can not enter the p⁺⁺ diffusion layer 9a.

Moreover, the p⁺⁺ diffusion layer 9a does not electrically insulate the p⁻ epitaxial layer 2 completely as distinct from an insulation, but permits majority carriers serving as signals to enter the p⁺⁺ diffusion layer 9a from the p⁻ epitaxial layer 2 if they have an energy equal to or higher than the potential barrier $V_A$ while blocking the entry of the minority carriers.

Thus, the semiconductor device of the first preferred embodiment prevents the minority carriers injected from the external signal input circuit 7 to the p⁻ epitaxial layer 2 from reaching the n⁺ diffusion layer 4b since the minority carriers, i.e., electrons can not enter the p⁺⁺ diffusion layer 9a as being by the potential barrier $V_A$ between the p⁻ epitaxial layer 2 and the p⁺⁺ diffusion layer 9a. Therefore, the injection of the minority carriers never cause a decrease of accumulated charges in the memory cell capacitor 5 resulting in a loss of stored information.

Figure 3:
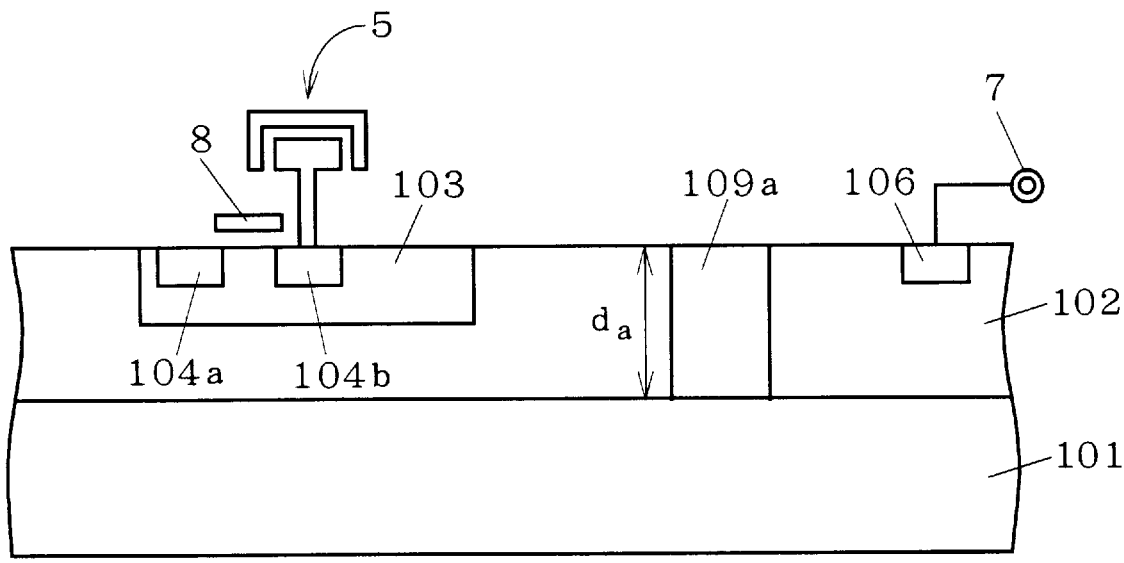
FIG. 3 is a cross section showing a structure of a semiconductor device in accordance with another aspect of the first preferred embodiment of the present invention.

The above discussion has been made on the semiconductor substrate of p-type conductivity. Similarly, in a case of an n-type semiconductor substrate ($n^{++}$ substrate) 101 of higher impurity concentration as shown in FIG. 3, provision of an $n^{++}$ diffusion layer 109a between the external input signal circuit 7 serving as a source for injection of the minority carriers (positive holes) and a $p^+$ diffusion layer 104b connected to the memory cell capacitor 5 prevents the minority carriers from reaching the $p^+$ diffusion layer 104b, thereby avoiding a failure of the DRAM.

Furthermore, besides the external signal input circuit 7, an internal potential generation circuit, a peripheral circuit logic (particularly in a DRAM with mixed logics), and a signal output circuit for outputting signals outside the chip may be employed as the source for injection of the minority carriers. In any case, the semiconductor device of the first preferred embodiment can avoid a failure of the DRAM due to the injection of the minority carriers.

The Second Preferred Embodiment

Figure 4:
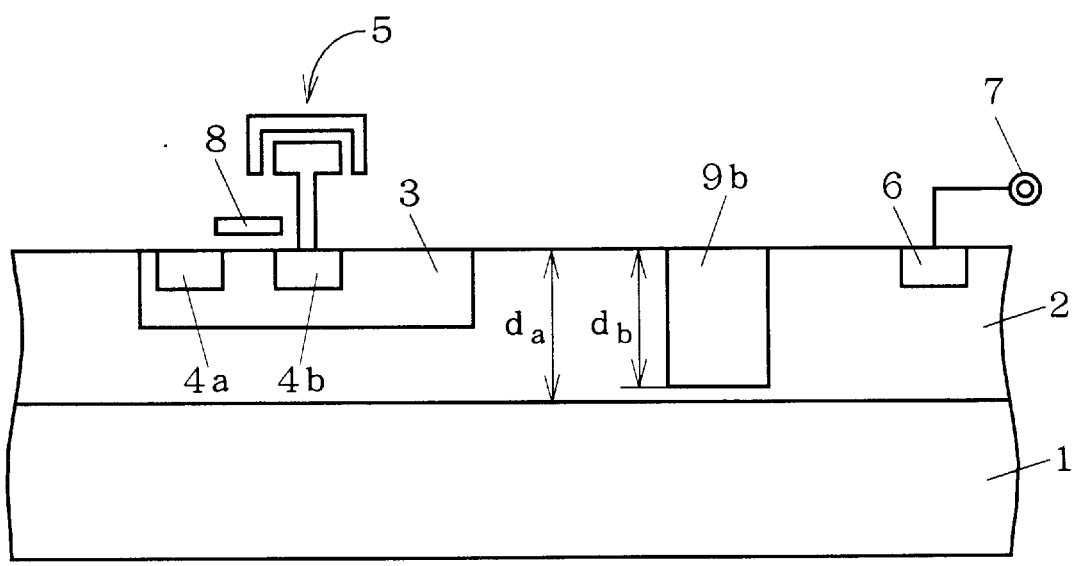
FIG. 4 is a cross section showing a structure of a semiconductor device in accordance with a second preferred embodiment of the present invention.

FIG. 4 is a cross section showing a structure of a semiconductor device in accordance with the second preferred embodiment of the present invention. In the semiconductor device of the second preferred embodiment shown in FIG. 4, unlike the first preferred embodiment, a $p^{++}$ diffusion layer 9b extends up to a depth $d_b$. ($<d_a$) to leave a clearance between the $p^{++}$ diffusion layer 9b and the $p^{++}$ substrate 1.

Figure 5:
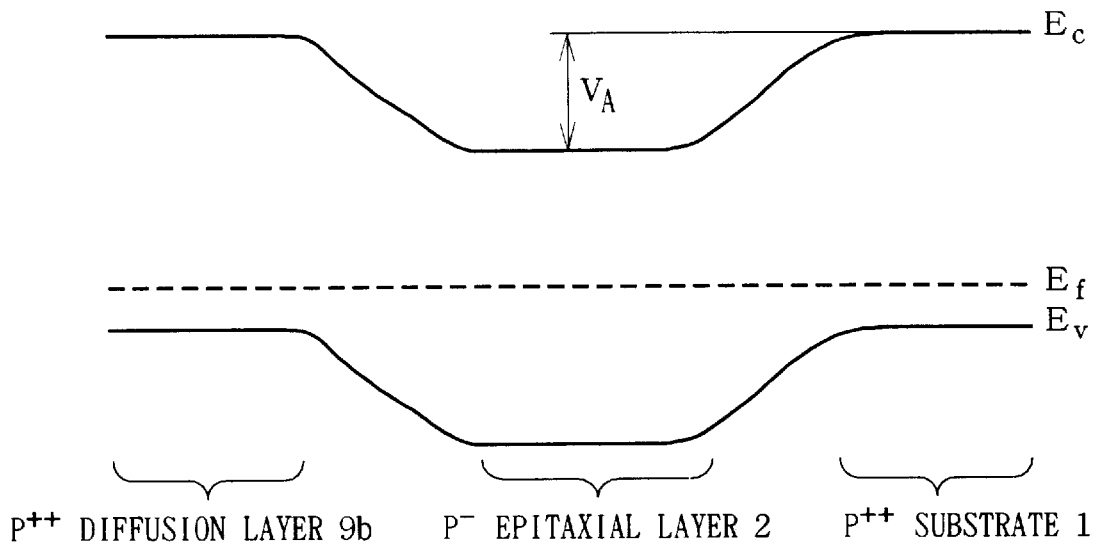
FIGS. 5 and 6 show energy bands of a p⁻ epitaxial layer 2, a p⁺⁺ diffusion layer 9b and a p⁺⁺ substrate 1.
Figure 6:
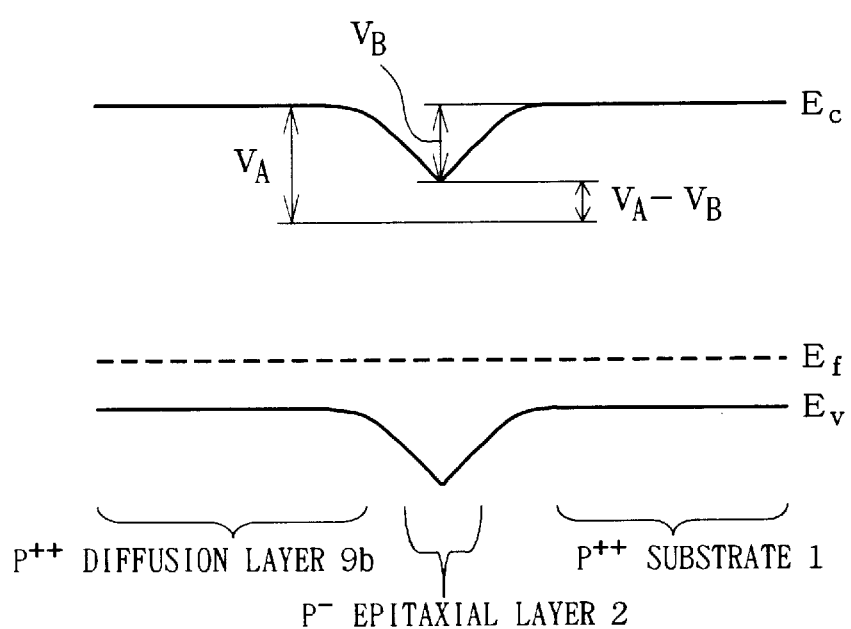

FIG. 5 shows an energy band of the $p^-$ epitaxial layer 2, the $p^{++}$ diffusion layer 9b and the $p^{++}$ substrate 1 in a case of large difference in depth ($d_a-d_b$) between the depth $d_a$ of the $p^-$ epitaxial layer 2 and the depth $d_b$ of the $p^{++}$ diffusion layer 9b while FIG. 6 shows an energy band in a case of small difference in depth ($d_a-d_b$). Furthermore, in both figures, it is assumed that the external signal input circuit 7 and the $n^+$ diffusion layer 4b are provided at the back and the front of the paper, respectively.

In the case of large difference in depth ($d_a-d_b$) as shown in FIG. 5, the minority carriers travel freely from the back to the front of the paper in the $p^-$ epitaxial layer 2. On the other hand, in the case of small difference in depth ($d_a-d_b$) as shown in FIG. 6, since the slope at the interface between the $p^{++}$ diffusion layer 9b and the $p^-$ epitaxial layer 2 and the slope at the interface between the $p^{++}$ substrate 1 and the $p^-$ epitaxial layer 2 intersect at a point with an energy being lower than $E_c$ by $V_B$ and $V_B$ is less than $V_A$, there arises a potential barrier ($V_A-V_B$) against the minority carriers moving from the back to the front of the paper. Accordingly, the minority carriers, i.e., electrons can not enter the region at the front of the paper as being blocked by the potential barrier ($V_A-V_B$) between the $p^-$ epitaxial layer 2 and the $p^{++}$ diffusion layer 9b. That prevents the minority carriers injected from the external signal input circuit 7 to the $p^-$ epitaxial layer 2 from reaching the $n^+$ diffusion layer 4b. Therefore, the injection of the minority carriers never cause a decrease of accumulated charges in the memory cell capacitor 5 resulting in a loss of stored information.

Moreover, In the semiconductor device of the second preferred embodiment, the majority carriers (positive holes in this case) travel freely from one side of the $p^{++}$ diffusion layer 9b to another through the clearance between the $p^{++}$ diffusion layer 9b and the $p^{++}$ substrate 1. That keeps potential level on both ides of the $p^{++}$ diffusion layer 9b constant.

The Third Preferred Embodiment

Figure 7:
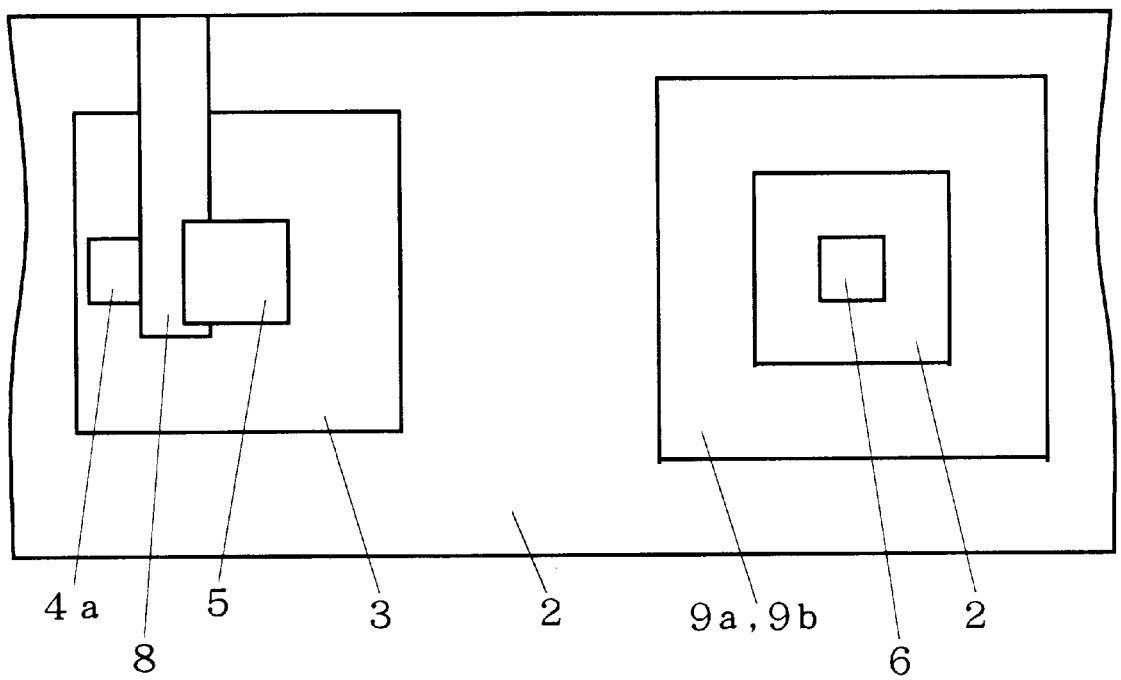
FIG. 7 is a plan view showing a structure of a semiconductor device in accordance with a third preferred embodiment of the present invention.

FIG. 7 is a plan view showing a structure of a semiconductor device in accordance with the third preferred embodiment of the present invention. In the semiconductor device of the third preferred embodiment, as shown in FIG. 3, the $p^{++}$ diffusion layer 9a or 9b for blocking the minority carriers is formed so as to surround the $n^+$ diffusion layer 6 connected to the external signal input circuit 7.

Thus, the semiconductor device of the third preferred embodiment can block the minority carriers with higher reliability as compared with the semiconductor device of the first or second preferred embodiment in which the $p^{++}$ diffusion layer 9a, or 9b is partially formed in a periphery of the $n^+$ diffusion layer 6.

The Fourth Preferred Embodiment

Figure 8:
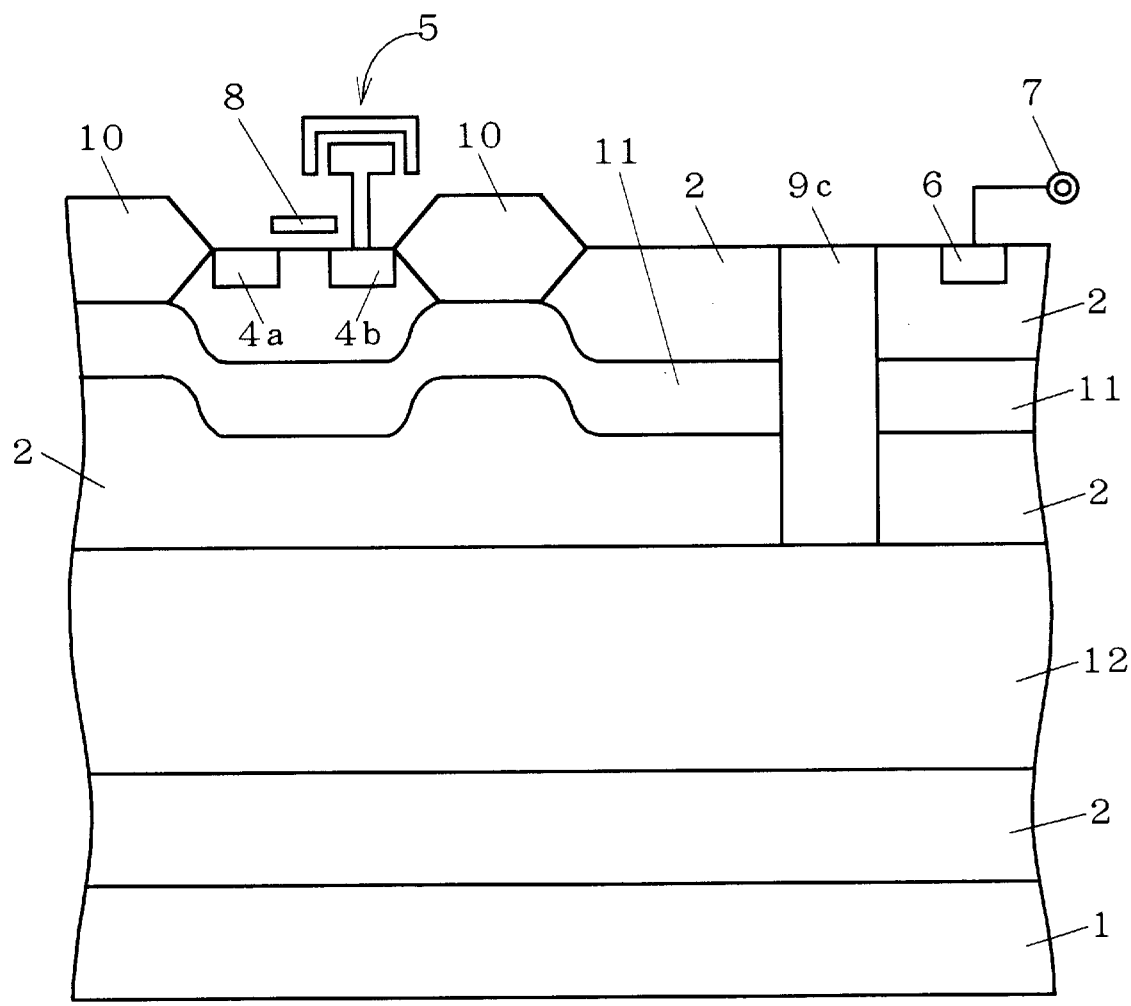
FIG. 8 is a cross section showing a structure of a semiconductor device in accordance with a fourth preferred embodiment of the present invention.

FIG. 8 is a cross section showing a structure of a semiconductor device in accordance with the fourth preferred embodiment of the present invention. On the $p^{++}$ substrate 1 provided is the $p^-$ epitaxial layer 2 having an impurity concentration lower than that of the $p^{++}$ substrate 1 and a thickness of about 2.0 μm. Further, in the $p^-$ epitaxial layer 2, a retrograde well 12 having a thickness of about 1.0 μm and a channel stopper layer 11 having a thickness of about 0.2 μm are formed by implanting an impurity (boron and the like in $p^-$ epitaxial layer and phosphorus and the like in $n^-$ epitaxial layer) into the $p^-$ epitaxial layer 2 using an ion implantation method. Oxide films for device isolation 10 are provided selectively on the $p^-$ epitaxial layer 2. Between the oxide films for device isolation 10, the $n^+$ diffusion layers 4a and 4b, the gate electrode 8 and the memory cell capacitor 5 are provided, like in the first preferred embodiment. On the other hand, the $n^+$ diffusion layer 6 is selectively formed in a region of the $p^-$ epitaxial layer 2 where none of the $n^+$ diffusion layers 4a and 4b is formed, to which the external signal input circuit 7 is connected. Further, a $p^{++}$ diffusion layer 9c is provided between the external signal input circuit 7 serving as a source for injection of the minority carriers (electrons) and the $n^+$ diffusion layer 4b connected to the memory cell capacitor 5, for blocking the minority carriers. The $p^{++}$ diffusion layer 9c extends up to such a depth as to reach the retrograde well 12 from a surface of the $p^-$ epitaxial layer 2.

Figure 9:
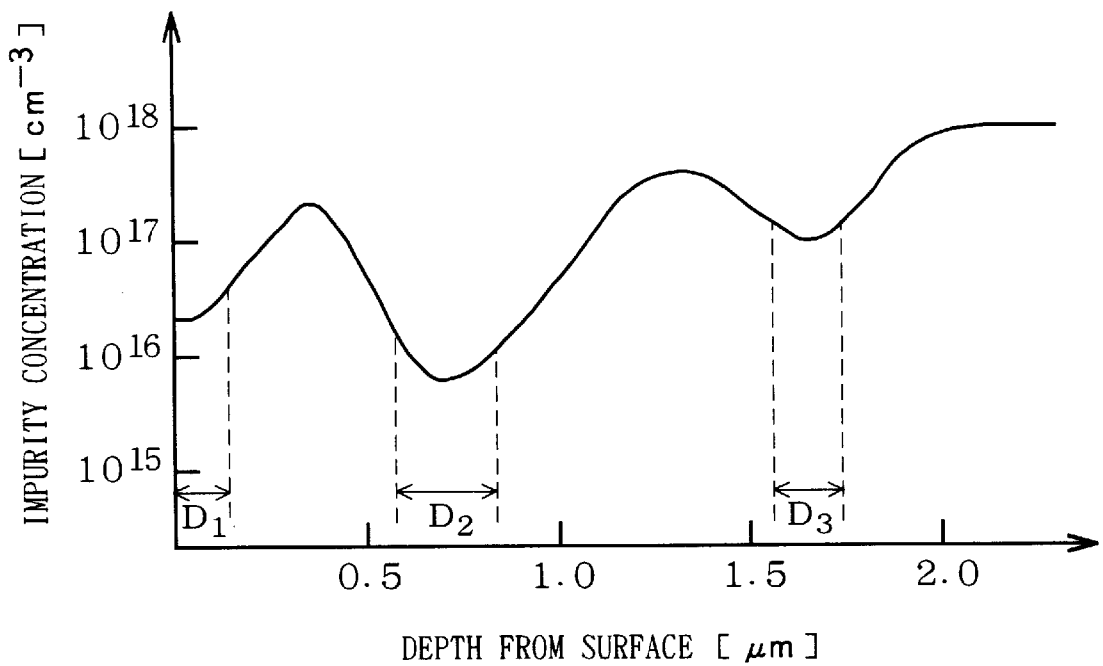
FIG. 9 is a graph showing a relation between the depth from a surface and the impurity concentration.

FIG. 9 is a graph showing a distribution of impurity concentration in a direction of depth in the $p^-$ epitaxial layer 2 of the semiconductor device of FIG. 8. Since the channel stopper layer 11 and the retrograde well 12 are formed by implanting impurities, the impurity concentration becomes higher towards the depth of about 0.3 μm where the channel stopper layer 11 is formed and the depth of about 1.3 μm where the retrograde well 12 is formed and reaches the peak at these depths from the surface.

What depth the minority carriers injected to the $p^-$ epitaxial layer 2 from the external signal input circuit 7 travel towards the $n^+$ diffusion layer 4b depending on the internal potential caused by the distribution of impurity concentration shown in FIG. 9. Specifically, the minority carriers are hard to travel at a depth with high impurity concentration since the internal potential is high and accordingly the minority carriers travel at the depths $D_1$ to $D_3$ with low impurity concentration shown in FIG. 9. However, the minority carriers hardly exist at the depth $D_3$ due to the high potential of the $p^{++}$ substrate 1 and the retrograde well 12 and the rectrograde well 12 have since the $p^{++}$ substrate 1 a high impurity concentration and therefore the minority carriers mainly travel at the depths $D_1$ and $D_2$.

In the semiconductor device of the fourth preferred embodiment, the $p^{++}$ diffusion layer 9c extending up to such a depth as to reach the retrograde well 12 from the surface of the $p^-$ epitaxial layer 2 can block the minority carriers traveling at the depths $D_1$ and $D_2$.

Thus, it is possible to prevent the minority carriers injected from the external signal input circuit 7 to the p⁻ epitaxial layer 2 from reaching the n⁺ diffusion layer 4b and therefore the injection of the minority carriers never cause a decrease of accumulated charges in the memory cell capacitor 5 resulting in a loss of stored information.

The Fifth Preferred Embodiment

Figure 10:
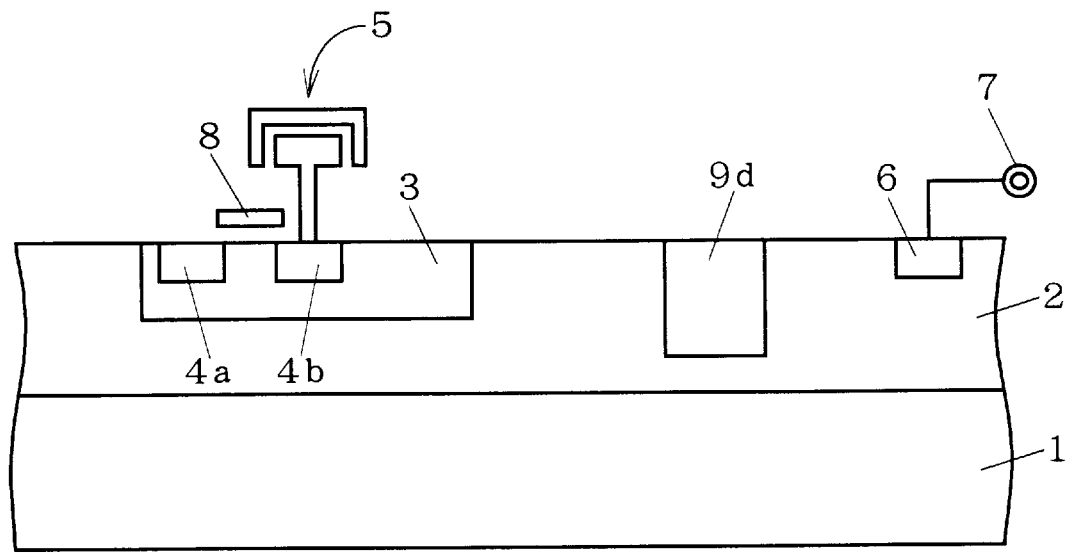
FIG. 10 is a cross section showing a structure of a semiconductor device in accordance with a fifth preferred embodiment of the present invention.

FIG. 10 is a cross section showing a structure of a semiconductor device in accordance with the fifth preferred embodiment of the present invention. On the p⁺⁺ substrate 1 provided is the p⁻ epitaxial layer 2 having an impurity concentration lower than that of the p⁺⁺ substrate 1. The p well 3 is formed in a portion of the p⁻ epitaxial layer 2 and further the n⁺ diffusion layers 4a and 4b are selectively formed in the p well 3. The memory cell capacitor 5 is connected onto the n⁺ diffusion layer 4b. The n⁺ diffusion layers 4a and 4b serving as source and drain constitute a transistor, with the gate electrode 8. On the other hand, the n⁺ diffusion layer 6 is selectively formed in the p⁻ epitaxial layer 2 separately from the p well 3, to which the external signal input circuit 7 is connected. Further, an n well 9d is provided between the external signal input circuit 7 serving as a source for injection of the minority carriers (electrons in this case) and the n⁺ diffusion layer 4b connected to the memory cell capacitor 5, for blocking the entry of the minority carriers.

Figure 11:
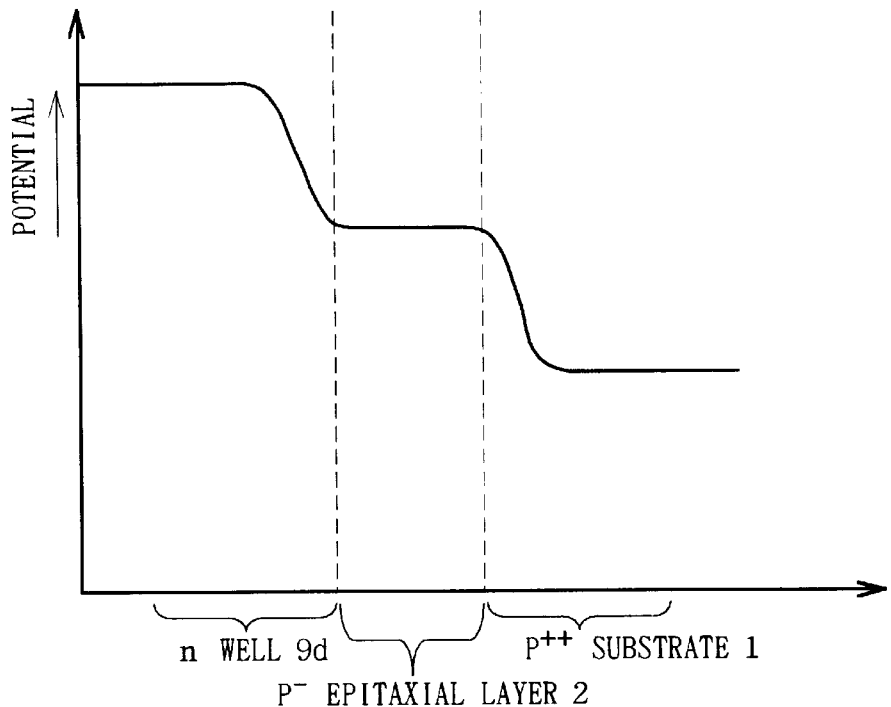
FIG. 11 shows a potential relation of an n well 9d, a p⁻ epitaxial layer 2 and a p⁺⁺ substrate 1.

FIG. 11 shows a potential relation of the p⁺⁺ substrate 1, the p⁻ epitaxial layer 2 and the n well 9d. The potential of the n well 9d is higher than that of the p⁻ epitaxial layer 2 as can be seen from FIG. 11 and an internal electric field is caused by the potential difference, ranging from the n well 9d to the p⁺⁺ substrate 1.

Thus, in the semiconductor device of the fifth preferred embodiment, since the minority carriers traveling between a bottom of the n well 9d and the p⁺⁺ substrate 1 are captured into the n well 9d due to the internal electric field existing from the n well 9d to the p⁺⁺ substrate 1, it is possible to prevent the minority carriers injected from the external signal input circuit 7 from reaching the n⁺ diffusion layer 4b.

Therefore, the injection of the minority carriers never cause a decrease of accumulated charges in the memory cell capacitor 5 resulting in a loss of stored information.

Figure 12:
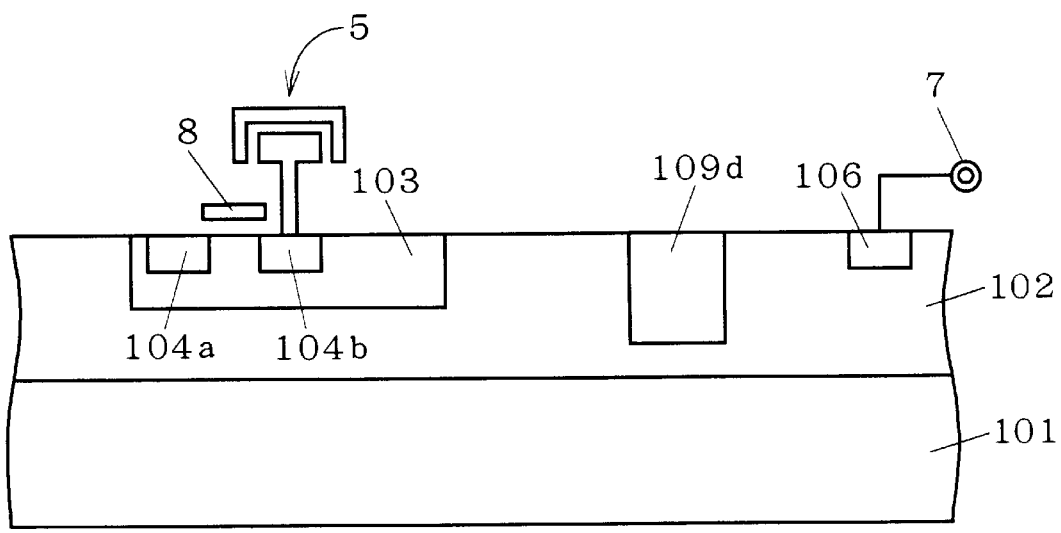
FIG. 12 is a cross section showing a structure of a semiconductor device in accordance with another aspect of the fifth preferred embodiment of the present invention.
Figure 13:
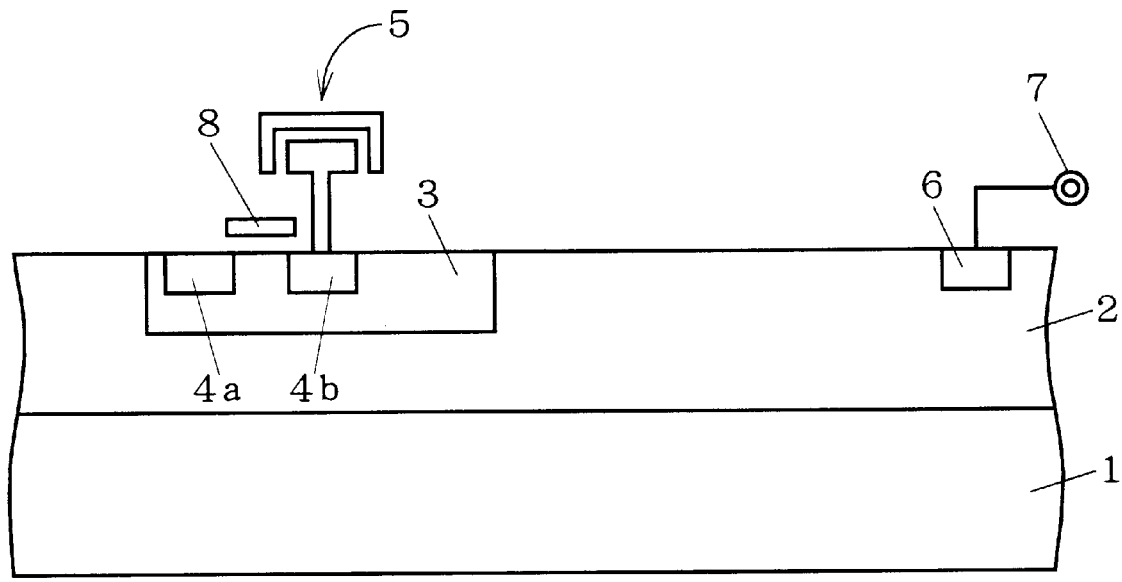
FIG. 13 is a cross section showing a structure of a DRAM in the background art.

The above discussion has been made on the semiconductor substrate of p-type conductivity. Similarly, in a case of the n-type semiconductor substrate (n⁺⁺ substrate) 101 of higher impurity concentration as shown in FIG. 12, provision of a p well 109d between the external input signal circuit 7 serving as a source for injection of the minority carriers (positive holes) and the p⁺ diffusion layer 104b connected to the memory cell capacitor 5 allows the minority carriers to be captured into the p well 109d, never to reach the p⁺ diffusion layer 104b.

Furthermore, the above first to fifth preferred embodiments may apply to an SRAM (Static Random Access Memory) as well as the DRAM.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor thin film of a first conductivity type provided on a semiconductor substrate of said first conductivity type;
   a first impurity diffusion layer of said first conductivity type provided in a form of layer in said semiconductor thin film;
   a second impurity diffusion layer of said first conductivity type provided in a form of layer at a depth shallower than a depth at which said first impurity diffusion layer is provided in said semiconductor thin film; and
   a minority-carrier source for generating minority carriers of a second conductivity type opposite to said first conductivity type and an impurity diffusion region of said first conductivity type each selectively provided in said semiconductor thin film,
   wherein each of impurity concentrations of said impurity diffusion region and said first and second impurity diffusion layers is higher than that of said semiconductor thin film, and
   said impurity diffusion region extends up to such a depth as to reach said first impurity diffusion layer from a surface of said semiconductor thin film.

2. The semiconductor device of claim 1, wherein said impurity diffusion region is provided so as to surround said minority-carrier source.

3. The semiconductor device of claim 1, wherein said semiconductor substrate, said impurity diffusion region and said semiconductor thin film each have p-type conductivity.

4. The semiconductor device of claim 1, wherein said semiconductor substrate, said impurity diffusion region and said semiconductor thin film each have n-type conductivity.

* * * * *